United States Patent
Fong et al.

(10) Patent No.: US 11,592,337 B2
(45) Date of Patent: Feb. 28, 2023

(54) EVAPORATIVE-COOLED SOLID-STATE BOLOMETER AND SINGLE-PHOTON DETECTOR

(71) Applicants: RAYTHEON BBN TECHNOLOGIES CORP., Cambridge, MA (US); MASSACHUSETTS INSTITUTE OF TECHNOLOGY, Cambridge, MA (US)

(72) Inventors: Kin Chung Fong, Concord, MA (US); Dirk Robert Englund, Brookline, MA (US)

(73) Assignees: RAYTHEON BBN TECHNOLOGIES CORP., Cambridge, MA (US); MASSACHUSETTS INSTITUTE OF TECHNOLOGY, Cambridge, MA (US)

( * ) Notice: Subject to any disclaimer, the term of this patent is extended or adjusted under 35 U.S.C. 154(b) by 16 days.

(21) Appl. No.: 17/400,047

(22) Filed: Aug. 11, 2021

(65) Prior Publication Data

US 2022/0146322 A1 May 12, 2022

Related U.S. Application Data

(60) Provisional application No. 63/111,492, filed on Nov. 9, 2020.

(51) Int. Cl.
G01J 5/06 (2022.01)
G01J 5/061 (2022.01)
(Continued)

(52) U.S. Cl.
CPC .............. G01J 5/061 (2013.01); G01J 5/20 (2013.01); H01B 12/02 (2013.01); H01L 39/223 (2013.01); H01L 39/228 (2013.01)

(58) Field of Classification Search
CPC ........ G01J 5/061; G01J 5/20; G01J 2001/442; H01B 12/02; H01L 39/223; H01L 39/228; Y02E 40/60
See application file for complete search history.

(56) References Cited

U.S. PATENT DOCUMENTS 9,577,176 B1  2/2017  Fong et al.
9,799,817 B2  10/2017 Fong et al.
(Continued)

OTHER PUBLICATIONS

Giazotto, F. et al., "Opportunities for mesoscopics in thermometry and refrigeration: Physics and applications", Reviews of Modern Physics, Jan. 2006, pp. 217-274, vol. 78, No. 1, The American Physical Society.

(Continued)

*Primary Examiner* — Marcus H Taningco
(74) *Attorney, Agent, or Firm* — Lewis Roca Rothgerber Christie LLP

(57) ABSTRACT

An evaporatively cooled device and a system including the same. In some embodiments, the system includes an oligolayer conductive sheet; a superconductor; a tunneling barrier, between the oligolayer conductive sheet and the superconductor; and a bias circuit, configured to apply a bias voltage across the tunneling barrier, the bias voltage being less than a gap voltage of the superconductor and greater than one-half of the gap voltage of the superconductor.

19 Claims, 5 Drawing Sheets

(51) Int. Cl.
    *G01J 5/20*     (2006.01)
    *H01L 39/22*     (2006.01)
    *H01B 12/02*     (2006.01)

(56) References Cited

U.S. PATENT DOCUMENTS

| | | |
|---|---|---|
| 9,933,310 B2 | 4/2018 | Fong |
| 9,945,728 B2 | 4/2018 | Fong |
| 10,454,016 B2 | 10/2019 | Fong et al. |
| 10,784,433 B2 | 9/2020 | Fong et al. |
| 2018/0337324 A1* | 11/2018 | Fong .................. G01J 5/24 |
| 2019/0288177 A1* | 9/2019 | Fong .................. H01L 39/123 |
| 2020/0272925 A1* | 8/2020 | Möttönen .......... H01L 39/223 |
| 2022/0278265 A1* | 9/2022 | Sun .................... H01L 39/22 |

OTHER PUBLICATIONS

Lee, G-H. et al., "Graphene-based Josephson junction microwave bolometer", Nature, Sep. 30, 2020, 13 pages, vol. 586.
Walsh, E. D. et al., "Graphene-Based Josephson-Junction Single-Photon Detector", Physical Review Applied, Aug. 24, 2017, pp. 024022-1 through 024022-11, vol. 8, American Physical Society.

\* cited by examiner

EVAPORATIVE-COOLED SOLID-STATE BOLOMETER AND SINGLE-PHOTON DETECTOR

CROSS-REFERENCE TO RELATED APPLICATION(S)

The present application claims priority to and the benefit of U.S. Provisional Application No. 63/111,492, filed Nov. 9, 2020, entitled "EVAPORATIVE-COOLED SOLID-STATE BOLOMETER AND SINGLE-PHOTON DETECTOR", the entire content of which is incorporated herein by reference.

The present application is related to the following U.S. patents, the entire contents of all of which are incorporated herein by reference: U.S. Pat. Nos. 9,933,310, 9,945,728, 9,577,176, 9,799,817, 10,454,016, and 10,784,433.

FIELD

One or more aspects of embodiments according to the present invention relate to low-temperature devices, and more particularly to a low-temperature device including an oligolayer structure of a Van der Waals (vdW) material.

BACKGROUND

Low-temperature devices based on a sheet of graphene have various applications, e.g., as infrared or microwave detectors and transistors. In such applications, it may be the case that the performance of the device improves as the temperature decreases. Cooling systems for achieving moderately low temperatures, such as 55 K or 4 K, may be relatively inexpensive and simple to operate, but cooling systems for reaching significantly lower temperatures (e.g., 0.5 K or 0.1 K) may be considerably more complex and costly.

Thus, there is a need for an improved system for cooling graphene.

SUMMARY

According to an embodiment of the present invention, there is provided a system, including: an oligolayer conductive sheet; a superconductor; a tunneling barrier, between the oligolayer conductive sheet and the superconductor; and a bias circuit, configured to apply a bias voltage across the tunneling barrier, the bias voltage being less than a gap voltage of the superconductor and greater than one-half of the gap voltage of the superconductor.

In some embodiments, the tunneling barrier includes an oligolayer insulating sheet.

In some embodiments, the oligolayer insulating sheet has fewer than 10 atomic layers.

In some embodiments, the oligolayer insulating sheet is a monolayer insulating sheet.

In some embodiments, the oligolayer insulating sheet is composed of hexagonal boron nitride.

In some embodiments, the tunneling barrier includes an oligolayer semiconductor sheet.

In some embodiments, the tunneling barrier is composed of molybdenum disulfide.

In some embodiments, the oligolayer conductive sheet has fewer than 10 atomic layers.

In some embodiments, the oligolayer conductive sheet is a monolayer sheet.

In some embodiments, the oligolayer conductive sheet is composed of graphene.

In some embodiments, the superconductor is amorphous.

In some embodiments, the superconductor is crystalline.

In some embodiments, the system includes: a first normal-insulating-superconducting junction including: the oligolayer conductive sheet, the superconductor, and the tunneling barrier; and further including a second normal-insulating-superconducting junction including: the oligolayer conductive sheet, a superconductor, and a tunneling barrier.

In some embodiments, the system further includes a refrigerator configured to cool: the oligolayer conductive sheet, the superconductor, and the tunneling barrier, to a first temperature, the first temperature being less than 3 K.

In some embodiments, the system is configured, upon the application of the bias voltage, to cool the oligolayer conductive sheet to a second temperature, the second temperature being less than 0.8 of the first temperature.

In some embodiments, the second temperature is less than 0.5 of the first temperature.

In some embodiments, the system includes a transistor, the transistor including a channel and a gate, wherein the oligolayer conductive sheet is configured to operate as the channel of the transistor.

In some embodiments, the system includes a bolometer including: a Josephson junction, the Josephson junction having a gap coupled to electrons of the oligolayer conductive sheet.

In some embodiments, the system includes a photon detector including a circuit configured to measure thermal noise in the oligolayer conductive sheet.

BRIEF DESCRIPTION OF THE DRAWINGS

Features, aspects, and embodiments are described in conjunction with the attached drawings, in which.

DETAILED DESCRIPTION

The detailed description set forth below in connection with the appended drawings is intended as a description of exemplary embodiments of a system and method for cooling graphene provided in accordance with the present invention and is not intended to represent the only forms in which the present invention may be constructed or utilized. The description sets forth the features of the present invention in connection with the illustrated embodiments. It is to be understood, however, that the same or equivalent functions and structures may be accomplished by different embodiments that are also intended to be encompassed within the scope of the invention. As denoted elsewhere herein, like element numbers are intended to indicate like elements or features.

Figure 1:
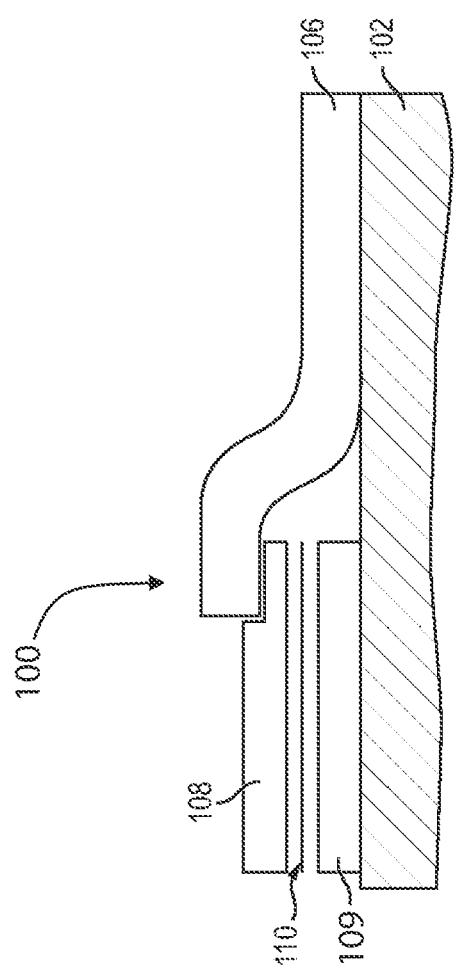
FIG. 1 is a schematic cross-sectional view of a graphene-insulating-superconducting junction, according to an embodiment of the present invention.

Referring to FIG. 1, a graphene-insulating-superconducting (GIS) junction 100 may include a graphene sheet 110 (sandwiched between two insulating layers 108, 109 (one or both of which may be composed of hexagonal boron nitride), and a superconducting layer 106, separated from the sandwich by a tunneling barrier (which may be the upper insulating layer 108). The graphene-insulating-superconducting junction may be constructed on a substrate 102. The thickness of the graphene sheet 110 may be 1 atomic layer, or a small number of atomic layers (e.g., 2, 3, or 4 layers). The junction between the superconductor 106 and the graphene sheet 110 may be a two-dimensional junction in the area in which the surfaces overlap. The insulating layer within the junction may be either the hexagonal boron nitride or another insulating material. The graphene-insulating-superconducting junction may be a two-terminal device, with one terminal being the superconducting layer 106 and the other terminal being the graphene sheet 110. In some embodiments, it is advantageous for the insulating layer between the superconductor 106 and the graphene sheet 110, which forms a tunneling barrier, to be thin, as discussed in further detail below, and, if the tunneling barrier is formed by an upper hexagonal boron nitride layer 108, the upper hexagonal boron nitride layer 108 may be thin, or, as shown in FIG. 1, it may be locally thinned to provide a suitable thickness for quantum tunneling.

Figure 2:
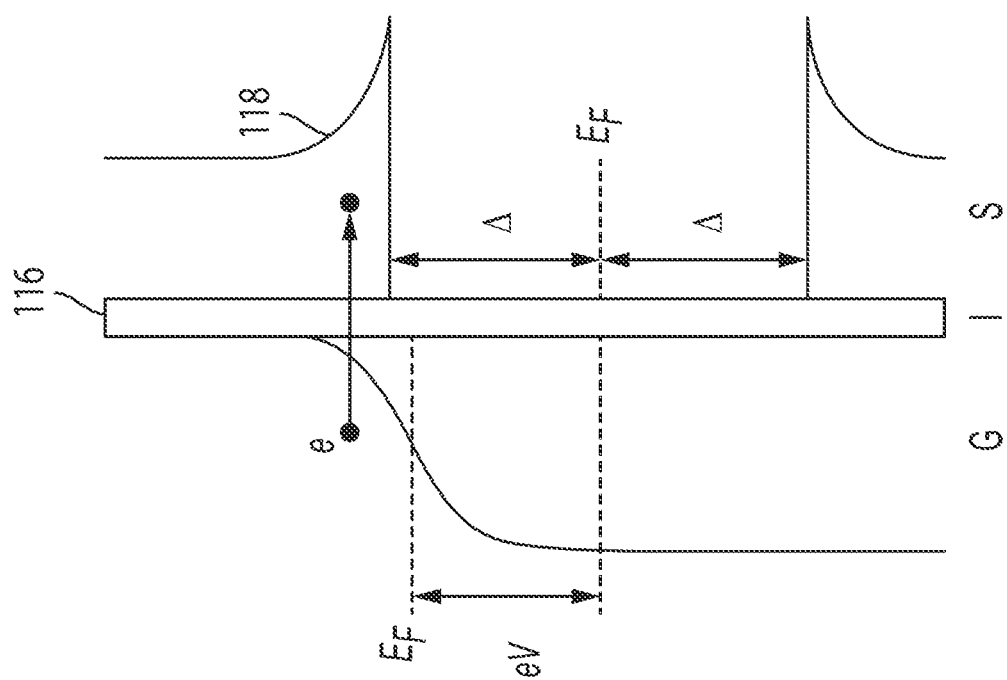
FIG. 2 is a band diagram of a graphene-insulating-superconducting junction, according to an embodiment of the present invention.

FIG. 2 shows a band diagram for the graphene-insulating-superconducting junction 100 when a bias voltage V is applied, in a direction causing the Fermi level to be raised in the graphene sheet 110 relative to the Fermi level in the superconductor 106. It may be seen that because the density of states in the energy gap of the superconductor 106 is suppressed (e.g., zero), tunneling, through the tunneling barrier 116, from the graphene sheet 110 to the superconductor 106, is suppressed (e.g., absent) except for electrons, in the graphene sheet 110, with sufficiently high energy to tunnel into the upper band of available states 118. The departure of these relatively high-energy electrons from the graphene sheet 110 results in a cooling of the graphene sheet 110 (and, equivalently, a sharpening, or "squaring", of the distribution of electron energies in the graphene sheet 110). The energy difference Δ between the Fermi energy $E_F$ in the superconductor 106 and the lower edge of the upper band of available states 118 may be referred to as the "energy gap" of the superconductor, and it is the product of the elementary charge e and a voltage that may be referred to as the "gap voltage". The gap voltage may be proportional to the critical temperature of the superconductor. The mechanism of cooling may be analogous to evaporative cooling of a hot liquid, in which cooling occurs in part because molecules with higher than average kinetic energy preferentially escape from the liquid phase, reducing the average kinetic energy of the molecules remaining in the liquid phase. The electron temperature of the graphene sheet 110 may be out of equilibrium with the temperature of the lattice of the graphene sheet 110 (to which the electrons may be only weakly coupled). Accordingly, the "temperature" of the graphene sheet 110, as used herein, refers to the absolute temperature of the electrons of the graphene sheet.

Joule heating, resulting from the tunneling of electrons through the tunneling barrier, may partially counteract the cooling effect; it may therefore be advantageous to minimize Joule heating, e.g., by employing a tunneling barrier 116 that is as thin as possible. As such, in some embodiments, the tunneling barrier 116 is, or includes, a sheet of a two-dimensional van der Waals material, such as hexagonal boron nitride. The sheet may have relatively few atomic layers of thickness, e.g., it may be a monolayer sheet, a bilayer sheet, a sheet with between 3 and 10 layers, or a sheet with 20 or fewer layers. In some embodiments, a semiconductor material having a band structure suitable for operating as a tunneling barrier 116 (e.g., molybdenum disulfide (MoS2), MoSe2, or WSe2 which are also two-dimensional van der Waals materials) may be used instead of an insulator (when this is the case the structure of FIG. 1 may nonetheless be referred to as a "graphene-insulating-superconducting junction"). As used herein, a sheet of a two-dimensional van der Waals material having no more than 20 layers is referred to as an "oligolayer sheet". If the sheet is an insulating sheet, it may be referred to as an "oligolayer insulating sheet", and if it is conductive, it may be referred to as an "oligolayer conductive sheet".

The rate of cooling (i.e., the rate at which heat flows out of the graphene sheet 110) may be a function of the bias voltage, and it may be greatest for a certain value of the bias voltage, which may be less than the gap voltage and greater than one-half of the gap voltage. The graphene-insulating-superconducting junction 100 may also exhibit cooling of the graphene sheet 110 if a bias voltage of the opposite sign is applied because, in the presence of such a bias, quasiholes tunnel through the tunneling barrier 116, with the same cooling effect. As such, a pair of graphene-insulating-superconducting junctions 100 connected back to back (with a single shared graphene sheet 110, to form a two-junction structure that may be referred to as a superconducting-insulating-graphene-insulating-superconducting ((SI) GIS) structure) may exhibit twice the rate of heat extraction from the graphene sheet 110.

Figure 3:
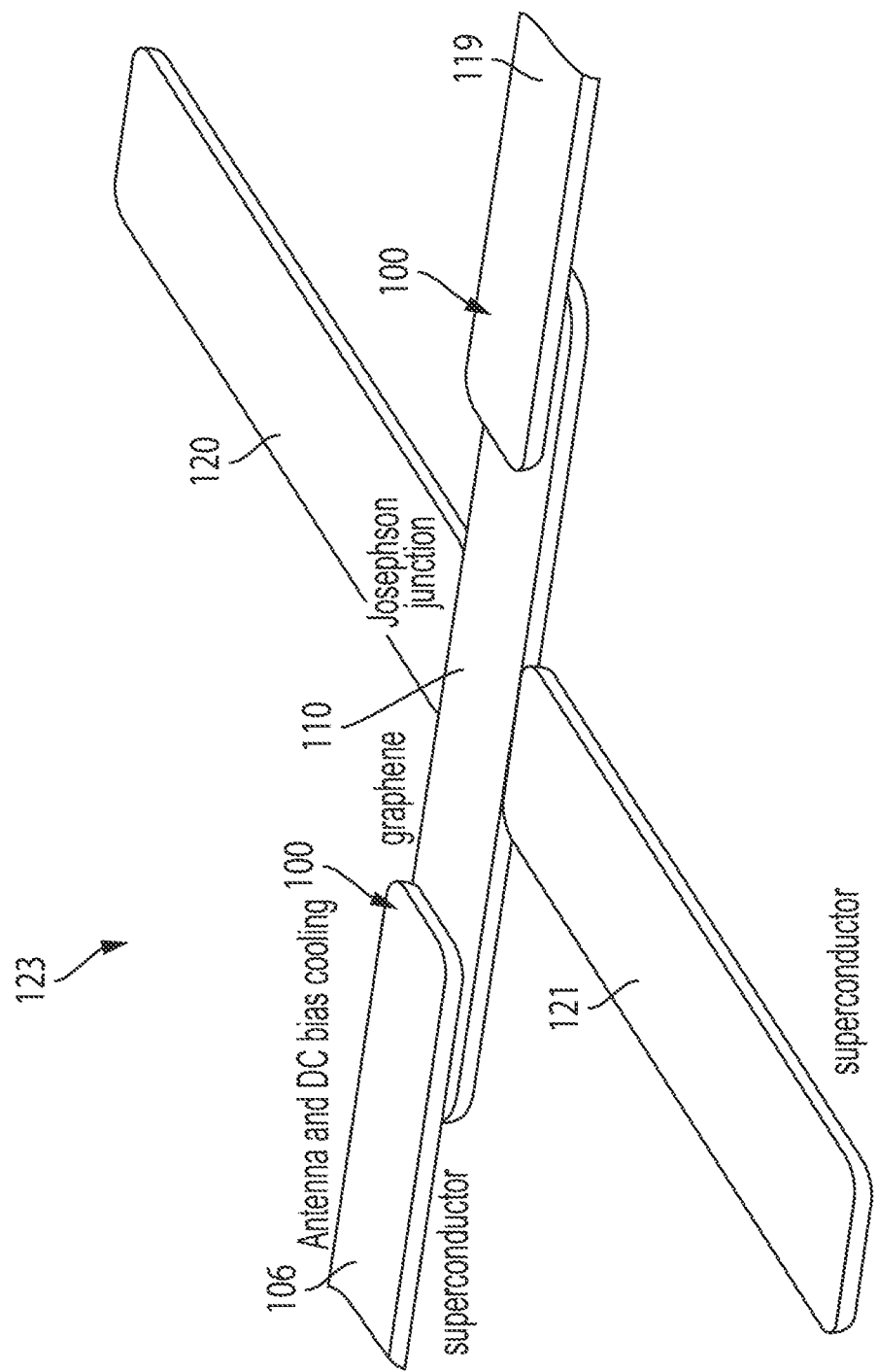
FIG. 3 is a schematic perspective view of Josephson junction cooled by two graphene-insulating-superconducting junctions, according to an embodiment of the present invention.

FIG. 3 shows such a ((SI) GIS) structure, in a graphene-superconductor sensing element 123. The graphene-superconductor sensing element 123 includes a first superconductor 106, a second superconductor 119, a graphene sheet 110, and an insulating layer 108 (e.g., a layer of hexagonal boron nitride) on the graphene sheet 110. The insulating layer 108 forms the tunneling barrier 116 of a graphene-insulating-superconducting junction 100 at each end of the graphene sheet 110. A bias circuit 122 (FIG. 4) may supply the bias voltage to each of the two graphene-insulating-superconducting junctions 100; as a result, the graphene sheet 110 may be cooled as described above. FIG. 3 also shows a third superconductor 120 and a fourth superconductor 121, that form, together with a portion of the graphene sheet 110, a Josephson junction, which may be part of a detector, as discussed in further detail below. Each of the graphene-insulating-superconducting junctions 100 may have the characteristics that, at DC, it exhibits a resistance (which may be referred to as the "tunneling resistance") and, at AC, it exhibits a small reactance and is effectively a short.

Figure 4:
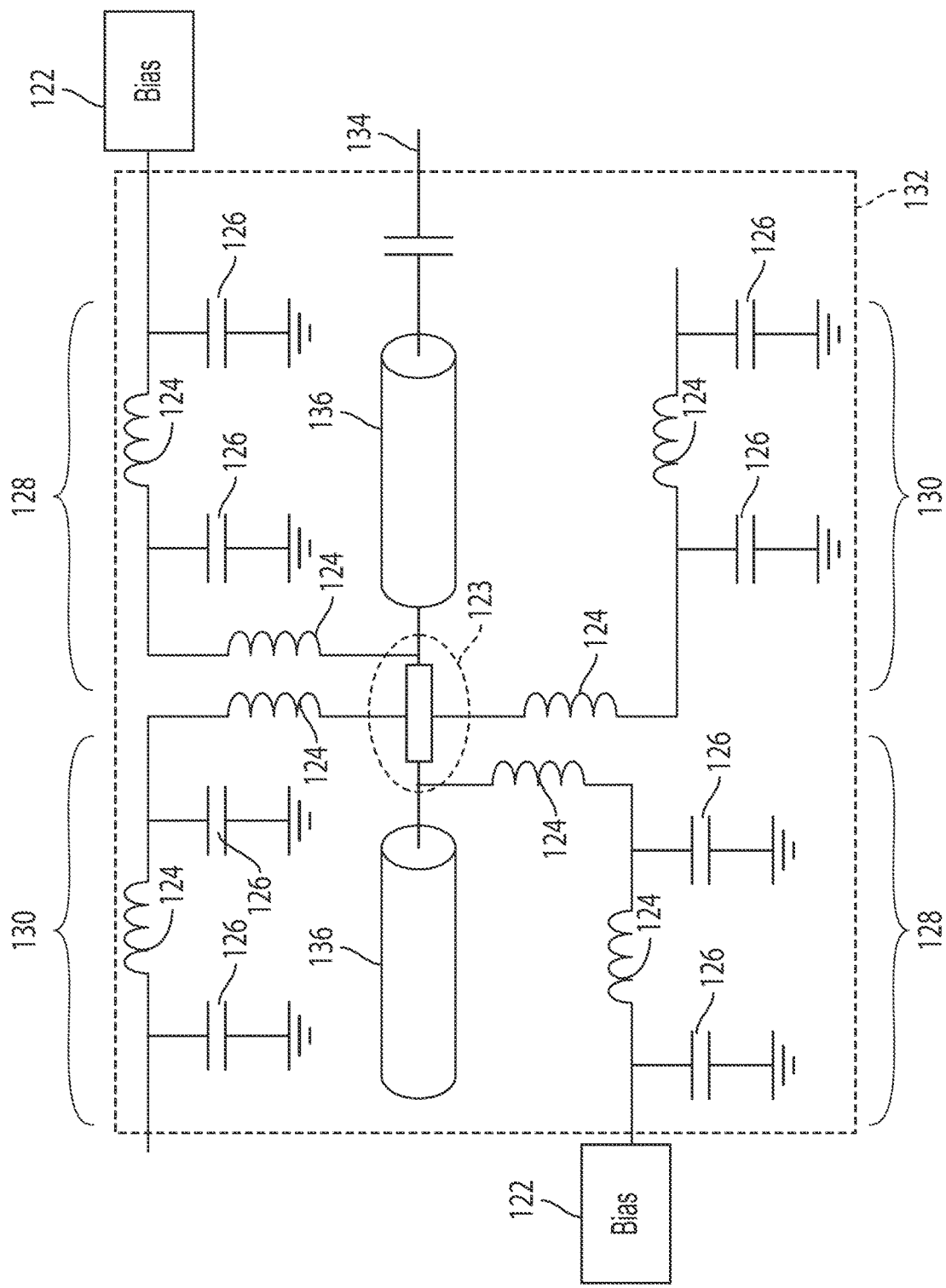
FIG. 4 is a schematic diagram of a cooled photon detector, according to an embodiment of the present invention.

FIG. 4 shows a microwave detector, using the graphene-superconductor sensing element 123 of FIG. 3. As described in Lee, Gil-Ho, "Graphene-based Josephson junction microwave bolometer," *Nature* Volume 586, pp. 42-46 (which, along with the accompanying online content, is incorporated herein by reference) the switching current $I_s$ of the Josephson junction may be measured to infer the temperature of Josephson junction, which in turn may be used to detect microwave radiation being absorbed by the graphene sheet 110. In some embodiments individual microwave photons may be detected by detecting short-duration changes in the temperature of the graphene sheet caused by the absorption of such photons. The circuit of FIG. 4, or (as shown) a portion of the circuit of FIG. 4, may be cooled by (e.g., it may be inside) a refrigerator 132, which may cool the circuit (or the portion of the circuit) to a moderately low temperature, e.g., a temperature between 0.5 K and 4 K. Cooling by the graphene-insulating-superconducting junction 100 may then further reduce the final temperature of the graphene sheet 110, e.g., by 20% or more, e.g., by up to a factor of 3 or 5. In some embodiments, the operation (refrigeration) temperature is lower than the transition temperature Tc of the superconductor, e.g., at least 0.5*Tc or lower. As mentioned above, the bias voltage may be less than the gap voltage, e.g., for the lowest final temperature, the bias voltage may be slightly lower than the gap voltage.

In FIG. 4, the bias voltage may be applied to each of the two graphene-insulating-superconducting junctions 100 through a cooling bias network 128 including a plurality of inductors 124 and a plurality of capacitors 126 as shown. A similar Josephson junction bias network 130 is used to apply a bias to the Josephson junction. The input 134 (at which microwave photons to be detected may be received, e.g., from an antenna) is connected to the graphene-superconductor sensing element 123 through a quarter-wave resonator 136, which operates as an impedance matching transformer. If an antenna is connected to the input, if may be, for example, a bowtie antenna, a log periodic antenna, or a twin slot antenna. Examples of antennas are described and illustrated in the U.S. patents incorporated herein by reference. Another quarter-wave resonator 136 acts as an open quarter-wave stub, to provide an RF ground at the other end of the graphene-superconductor sensing element 123. The bias circuit 122 is shown, in FIG. 4, for ease of illustration, as two separate blocks; in some embodiments it is however constructed as a single circuit.

Figure 5:
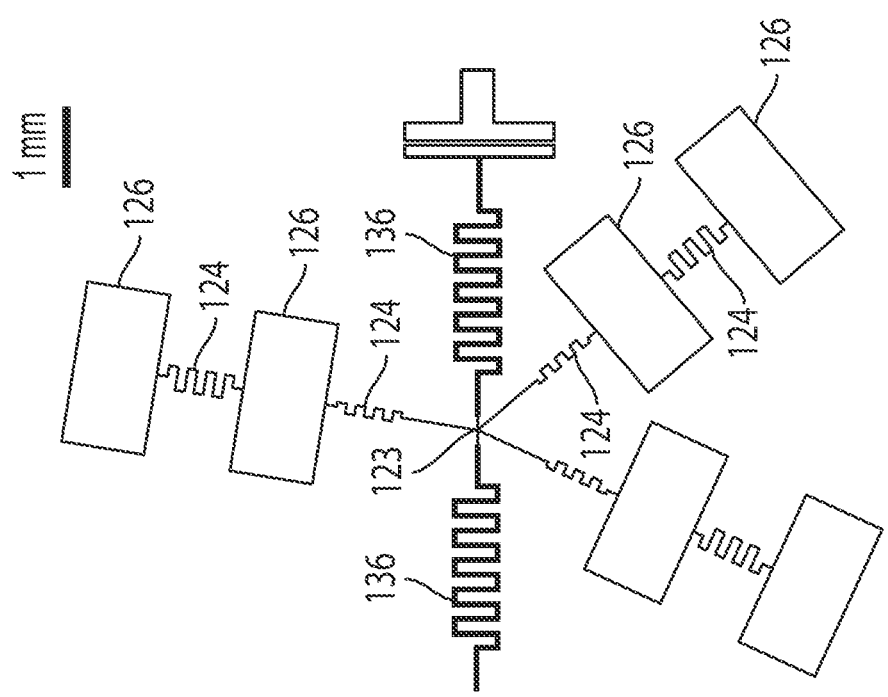
FIG. 5 is a layout diagram (drawn to scale for one embodiment) of a cooled photon detector, according to an embodiment of the present invention.

FIG. 5 shows a layout corresponding to portions of FIG. 4. FIG. 5 shows a connection to a local gate of the Josephson junction (not shown, for clarity, in FIG. 4), and does not show the cooling bias network 128.

Similar cooling arrangements may be made in other systems or devices employing a graphene sheet 110. For example, a cooling arrangement of the kind described herein may be used to cool a graphene sheet that is part of a microwave or infrared detector that (i) operates by measuring Johnson noise in a graphene sheet as an indication of absorption of photons (e.g., a bolometer, as described in U.S. Pat. No. 9,933,310, or a single-photon detector, as described in U.S. Pat. No. 9,945,728), or that (ii) is part of a Josephson junction-based microwave or infrared bolometer or single-photon detector (as described in U.S. Pat. Nos. 9,577,176 and 9,799,817).

In other embodiments, a graphene sheet cooled as described herein may include the graphene portion of a graphene-insulating-superconducting junction 100 that may be configured to operate as a single-photon detector or as a bolometer (as described in U.S. Pat. No. 10,454,016). In such an embodiment, the graphene-insulating-superconducting junction 100 used for sensing the temperature of the graphene sheet may be an additional (e.g., a third) graphene-insulating-superconducting junction 100, or it may be one of the graphene-insulating-superconducting junctions 100, used to cool the graphene sheet. In some embodiments, a graphene sheet cooled as described herein may be configured to operate as the gate of a transistor (as described in U.S. Pat. No. 10,784,433).

In some embodiments, a sheet of another conductive two-dimensional van der Waals material is used instead of the graphene sheet 110, to similar effect. The sheet (whether a graphene sheet 110 or a sheet of another material) may have relatively few atomic layers of thickness, e.g., it may be a monolayer sheet, a bilayer sheet, a sheet with between 3 and 10 layers, or a sheet with up to 20 layers.

As used herein, a "superconductor" is a material or object that is superconducting under suitable conditions (e.g., at sufficiently low temperature, current density, and external magnetic field). As such, consistent with this terminology, aluminum (or, e.g., niobium, niobium alloys (e.g., niobium titanium nitride), niobium nitride, molybdenum rhenium, rhenium, rhenium alloys, or NbSe2), or a conductive trace composed of aluminum (or, e.g., of niobium, niobium alloys (e.g., niobium titanium nitride), niobium nitride, molybdenum rhenium, rhenium, rhenium alloys, or NbSe2), for example, may be referred to as a "superconductor" even when it is at room temperature. In some embodiments, the superconductors described herein (e.g., the first superconductor 106, the second superconductor 119, the third superconductor 120, and the fourth superconductor 121) may be composed of an amorphous superconductor which may be deposited by evaporation; a relatively low deposition rate may be employed to produce a high quality film. Examples of suitable superconductor materials for such an embodiment include aluminum, niobium, niobium alloys (e.g., niobium titanium nitride), niobium nitride, molybdenum rhenium, rhenium, and rhenium alloys. In other embodiments the superconductors are composed of a crystalline superconductor, which may also be a two-dimensional van der Waals material. Examples of suitable superconductor materials for such an embodiment include niobium diselenide, and tungsten ditelluride.

Although limited embodiments of a system and method for cooling graphene have been specifically described and illustrated herein, many modifications and variations will be apparent to those skilled in the art. Accordingly, it is to be understood that a system and method for cooling graphene employed according to principles of this invention may be embodied other than as specifically described herein. The invention is also defined in the following claims, and equivalents thereof.

What is claimed is:

1. A system, comprising:
an oligolayer conductive sheet;
a superconductor;
a tunneling barrier, between the oligolayer conductive sheet and the superconductor; and
a bias circuit, configured to apply a bias voltage across the tunneling barrier, the bias voltage being less than a gap voltage of the superconductor and greater than one-half of the gap voltage of the superconductor.

2. The system of claim 1, wherein the tunneling barrier comprises an oligolayer insulating sheet.

3. The system of claim 2, wherein the oligolayer insulating sheet has fewer than 10 atomic layers.

4. The system of claim 2, wherein the oligolayer insulating sheet is a monolayer insulating sheet.

5. The system of claim 2, wherein the oligolayer insulating sheet is composed of hexagonal boron nitride.

6. The system of claim 1, wherein the tunneling barrier comprises an oligolayer semiconductor sheet.

7. The system of claim 6, wherein the tunneling barrier is composed of molybdenum disulfide.

8. The system of claim 1, wherein the oligolayer conductive sheet has fewer than 10 atomic layers.

9. The system of claim 1, wherein the oligolayer conductive sheet is a monolayer sheet.

10. The system of claim 1, wherein the oligolayer conductive sheet is composed of graphene.

11. The system of claim 1, wherein the superconductor is amorphous.

12. The system of claim 1, wherein the superconductor is crystalline.

13. The system of claim 1, comprising:
a first normal-insulating-superconducting junction comprising:
the oligolayer conductive sheet,
the superconductor, and
the tunneling barrier; and
further comprising a second normal-insulating-superconducting junction comprising:
the oligolayer conductive sheet,
a superconductor, and
a tunneling barrier.

14. The system of claim 1, further comprising a refrigerator configured to cool:
the oligolayer conductive sheet,
the superconductor, and
the tunneling barrier,
to a first temperature, the first temperature being less than 3 K.

15. The system of claim 14, wherein the system is configured, upon the application of the bias voltage, to cool the oligolayer conductive sheet to a second temperature, the second temperature being less than 0.8 of the first temperature.

16. The system of claim 15, wherein the second temperature is less than 0.5 of the first temperature.

17. The system of claim 1, comprising a transistor, the transistor comprising a channel and a gate,
wherein the oligolayer conductive sheet is configured to operate as the channel of the transistor.

18. The system of claim 1, comprising a bolometer comprising:
a Josephson junction, the Josephson junction having a gap coupled to electrons of the oligolayer conductive sheet.

19. The system of claim 1, comprising a photon detector comprising a circuit configured to measure thermal noise in the oligolayer conductive sheet.

* * * * *